United States Patent [19]

Prieto et al.

[11] Patent Number: 4,595,885
[45] Date of Patent: Jun. 17, 1986

[54] ADJUSTABLE ACTIVE FILTER

[75] Inventors: Yolanda Prieto, Miami; Walter L. Davis, Plantation, both of Fla.

[73] Assignee: Motorola, Inc., Schaumburg, Ill.

[21] Appl. No.: 655,823

[22] Filed: Oct. 1, 1984

[51] Int. Cl.[4] .............................................. H03F 3/191
[52] U.S. Cl. .................................... 330/303; 330/305; 330/306
[58] Field of Search ............... 330/109, 289, 294, 296, 330/303, 304, 305, 306, 288

[56] References Cited

U.S. PATENT DOCUMENTS 3,480,835 11/1969 Richman .
4,207,538 6/1980 Goel .
4,238,738 12/1980 Komori .
4,260,956 4/1981 Harford .
4,267,519 5/1981 Schade, Jr. .
4,340,868 7/1982 Pace .................................. 330/303 X
4,424,461 1/1984 Taguchi et al. .
4,438,411 3/1984 Rubin et al. .
4,513,254 4/1985 Harr .................................... 330/294

Primary Examiner—Eugene R. LaRoche
Assistant Examiner—Steven J. Mottola
Attorney, Agent, or Firm—Joseph T. Downey; Edward M. Roney; Donald B. Southard

[57] ABSTRACT

An adjustable active filter includes a transconductance amplifier (60) and a current source (40, 42) which may be adjusted in value. The resonant frequency of the active filter may be adjusted upwards by increasing the bias current of the transconductance amplifier using a frequency trim up network (48). The resonant frequency may be adjusted downward by decreasing the bias current using a frequency trim down network (44). The trim is preferably accomplished by shorting out zener diodes (120, 122, 124, 126, 150, 152) which control the bias current of the transconductance amplifier.

9 Claims, 7 Drawing Figures

ADJUSTABLE ACTIVE FILTER

BACKGROUND OF THE INVENTION

1. Field of the Invention

This invention relates generally to the field active filters. More particularly, this invention relates to the field of active filters suitable for use as phase shifters in quadrature demodulators.

2. Background

As progress is made toward miniaturization of FM transmitters and receivers, the FM demodulator remains one of the most difficult circuits to miniaturize. This is primarily due to the moderately high frequencies that are normally involved and the inability to reduce the size of inductors of suitably high inductance and Q factor for use in such demodulators. As the size of such devices diminishes it is also important that FM demodulators be capable of operation at very low voltage and current levels since battery size is a basic limitation in miniaturization of such devices.

Some types of FM slope detectors and the like also utilize crystals or ceramic resonators as portions of a demodulation circuit. This is as disadvantageous as using an inductor due to the fragility, size and expense of such devices.

The inductors used in quadrature demodulators are among the costliest, heaviest and least reliable components used in miniature receivers such as paging receivers and the like. It is therefore very desirable to eliminate their use in small and even in large electronic devices.

There are some demodulators available which may be implemented without the use of inductors, such as the phase locked loop and pulse counter type demodulator. Unfortunately, these demodulators suffer from a number of drawbacks including the inability to operate at the very low voltage and current levels necessary for battery operated receivers such as paging receivers. They are also frequently low Q devices exhibiting inferior noise performance. The pulse count demodulator has the further disadvantage that, except for operating frequencies below approximately 200 kHz, it provides a very low amplitude recovered signal. It is therefore desirable to provide a quadrature demodulator which may be fully implemented in integrated circuit form and operated at low voltage and current levels. The quadrature demodulator is frequently used in FM communications applications due to such desirable characteristics as high audio output and high signal to noise ratio. It is therefore very desirable to provide an inductorless version of a quadrature demodulator which may be fully integrated on a single integrated circuit.

Unfortunately, integrating a quadrature demodulator presents a number of technical challenges which must be overcome. This is especially true when the demodulator must be operated reliably over a wide range of temperatures and when steps must be taken to insure trimmability of the demodulator to assure optimum performance under all environmental conditions and integrated circuit processing variations. Under these conditions, highly temperature stable circuitry is required and the ability to precisely control temperature coefficients independent of the individual component temperature coefficients is very important. It is also important to have the ability to adjust circuit performance to account for variations in integrated circuit processing parameters, that is, to initially tune or adjust the circuit to overcome manufacturing variations in component values. The present invention provides solutions to these problems and others.

SUMMARY OF THE INVENTION

It is an object of the present invention to provide an improved quadrature demodulator.

It is another object of the present invention to provide an inductorless quadrature demodulator.

It is another object of the present invention to provide a trimmable temperature stable transconductance amplifier for use as an active filter in a quadrature demodulator.

It is another object of the present invention to provide an FM demodulator which operates at very low voltage and current levels to facilitate miniaturization and operation on small battery cells.

It is another object of the present invention to provide a temperature stable current source for use in integrated circuits such as the present demodulator.

It is another object of the present invention to provide a method of trimming a coilless FM demodulator.

It is a further object of the present invention to provide an integratable quadrature demodulator which operates under very low voltage and current conditions.

It is yet another object to provide an integratable quadrature demodulator that can be trimmed or adjusted to frequency while the final integrated circuit is still in wafer form.

These and other objects, advantages and features of the present invention will become apparent to those skilled in the art upon consideration of the following description of the invention.

In one embodiment of the present invention, an adjustable active filter, includes a transconductance amplifier having an input and an output and an adjustable current source for providing a controlled level of current to the transconductance amplifier. A feedback network is coupled to the input and output and establishes predetermined filter characteristics from input to output. A current adjusting circuit is coupled to the transconductance amplifier, for adjusting the current provided by the current source to the transconductance amplifier, so that adjusting the current alters the transconductance of the transconductance amplifier thereby effectively adjusting the filter's resonant frequency.

The features of the invention believed to be novel are set forth with particularity in the appended claims. The invention itself, however, both as to organization and method of operation, together with further objects and advantages thereof, may be best understood by reference to the following description taken in conjunction with the accompanying drawings.

DESCRIPTION OF THE PREFERRED EMBODIMENT

Figure 1:
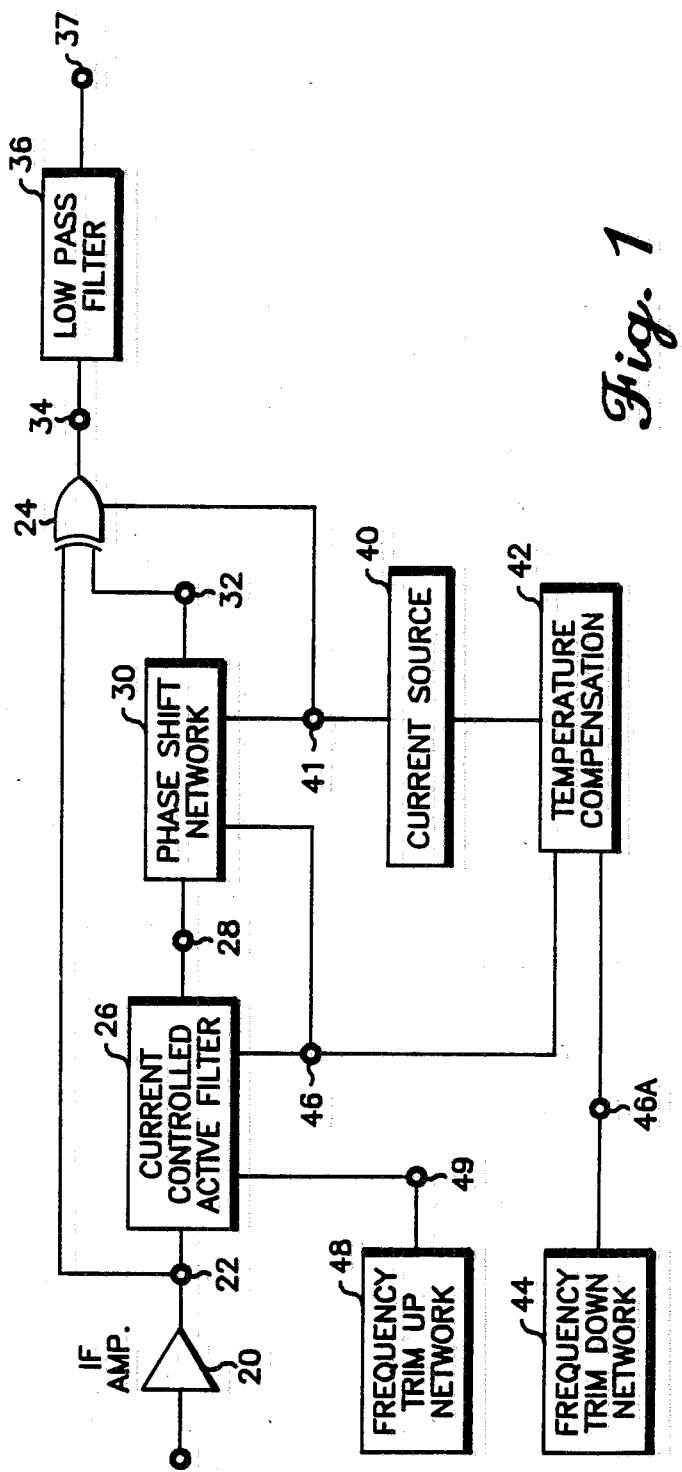
FIG. 1 shows a block diagram of the inductorless quadrature demodulator of the present invention.

Turning now to FIG. 1, a block diagram of the quadrature demodulator of the present invention is shown. Preferably, the present demodulator with the component values shown operates at 455 Khz but this is not to be limiting as one skilled in the art will recognize that other frequencies may be implemented. It is desirable to use commonly used intermediate frequencies such as 455 Khz in order to take advantage of readily available and inexpensive ceramic filters and other components in the receiver design.

An intermediate frequency (I.F.) amplifier 20 provides a limited I.F. signal to node 22 which is coupled to one input of an EXCLUSIVE OR circuit or gate 24. The input of the I.F. amplifier 20 is of course driven by known circuit elements forming the front end of the receiver. The exact configuration of the front end may vary considerably but is not important to the understanding of the present invention. The same signal at node 22 is fed to the input of a current controlled active filter 26 which in turn provides a filtered signal to node 28 which is coupled to its output. Node 28 is coupled to the input of a phase shift network 30. The output of phase shift network 30 is coupled to node 32 which is also coupled to the other input of EXCLUSIVE OR gate 24. Active filter 26 operates in conjunction with phase shift network 30 to provide the quadrature phase shifting mechanism for providing the quadrature signal in the present demodulator. The output of EXCLUSIVE OR 24 is coupled to node 34 which provides an input for a low pass filter 36. The output 37 of low pass filter 36 provides the recovered audio output signal of the demodulator. One skilled in the art will recognize that other types of logic gates may be substituted for EXCLUSIVE OR 24, but an EXCLUSIVE OR gate used as a coincidence-type phase detector has specific advantages in the present embodiment which will become apparent later.

In the preferred embodiment, the above circuits are preferrably fully implemented on a single integrated circuit which also includes a current source 40 for biasing various circuits including EXCLUSIVE OR 24 and phase shift network 30 at node 41. Current source 40 is preferably of a known design which provides a relatively stable bias current over changes in battery voltage and temperature. Active filter 26, however, requires a temperature compensated current source in the present embodiment for reasons which will become apparent later. In order to provide adequate temperature stability, a temperature compensation network 42 is coupled to current source 40 and is used to more fully compensate the effects of temperature on the active filter as will be more fully explained. The temperature compensated output at node 46 of temperature compensation network 42 is then coupled to active filter 26.

In order to assure that the demodulator is operative over a wide variety of variations in integrated circuit processing parameters and component tolerances, the resonant frequency of active filter 26 is adjustable in the preferred embodiment. A frequency trim down network 44 is coupled to temperature compensation network 42 at node 46A and to active filter 26, to provide for lowering the resonant frequency. A frequency trim up network 48 is provided for increasing the resonant frequency of the active filter and is attached to active filter 26 at node 49. Temperature compensation network 42 may also provide bias to a portion of phase shift network 30 at node 46 to insure a stable level of output to node 32 over various changes in temperature, but this is not to be limiting as bias current for the phase shift network 42 may also be provided by other sources of current.

Figure 2:
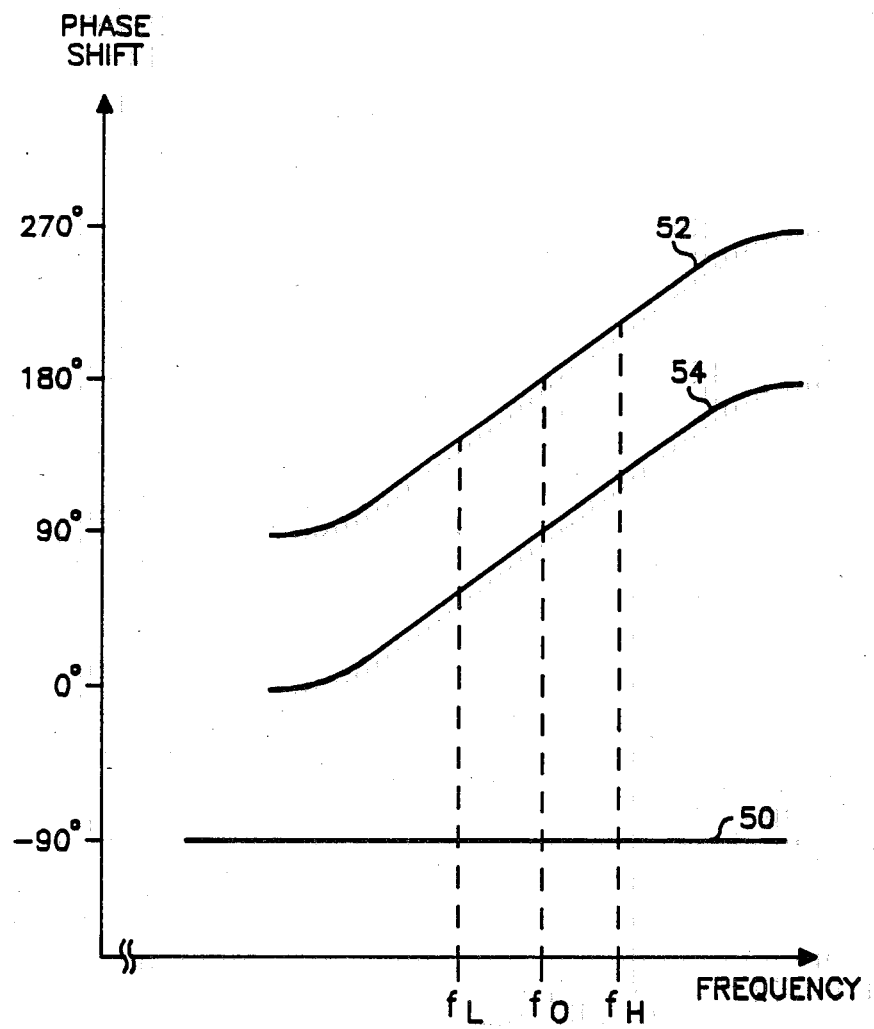
FIG. 2 shows a graph of the phase shift characteristics of the active filter and the phase shift network of the present invention.

In operation, active filter 26 operates in cooperation with phase shift network 30 to provide a signal at node 32 which is in quadrature (90 degrees shifted in phase) with the signal at node 22 at the center frequency $f_0$ of operation of the demodulator, and which varies about 90 degrees in phase as the input signal frequency is shifted about its center value. Phase shift network 30 provides a constant phase shift of $-90$ degrees over a range of frequencies from at least approximately $f_l$ to $f_h$ as shown in FIG. 2 as curve 50 where $f_l$ is the lowest frequency that the input signal may normally deviate to and $f_h$ is the highest frequency signal that the signal may normally deviate to. In addition, phase shift network 30 preferably includes an amplifying circuit to assure that a limited output signal is provided to node 32 for processing by EXCLUSIVE OR 24.

Active filter 26 provides the variable phase shift vs. frequency characteristic of the network, and it does so by simulating a resonant circuit having a Q significantly greater than 1.0 and preferably greater than about 3.0. In the preferred embodiment, a Q factor of approximately 5.0 to 10.0 is used. The phase shift versus frequency characteristic curve of the active filter shown as curve 52 of FIG. 2. This curve has a substantially linear positive slope which increases with frequency over the range of $f_l$ to $f_h$ in the preferred embodiment and is centered about 180 degrees at $f_0$. Of course, a similar curve with a linear negative slope which decreases with increasing frequency could be used with satisfactory results. The only difference this change would make to the performance of the demodulator is a 180 degree phase shift in the recovered audio. The slope of curve 52 is proportional to the Q of the active filter such that the slope increases as the Q increases. A high Q factor (preferably approximately 5) is desirable for active filter 26 as a higher Q results in a higher slope in curve 52 and ultimately a greater output voltage swing at the demodulator for a given amount of frequency deviation at node 22. The active filter of the preferred embodiment has a Q of approximately 10.

The active filter 26 and the phase shift network 30 are linear networks as far as phase shift is concerned in the frequency range of interest and their respective phase shift curves may therefore be added directly to obtain resultant curve 54. Curve 54 has the desired quadrature relationship at $f_0$ and the linear sloped phase shift from $f_l$ to $f_h$ so that active filter 26 in conjunction with phase shift network 30 provide an effective simulation of the phase shift network of a conventional quadrature demodulator having an inductor based phase shift mechanism. One skilled in the art will recognize that since active filter 26 and phase shift network 30 are in series, their respective locations can be reversed, with appropriate circuit modifications to assure proper interfaces, without deviating from the present invention. Of course it is still desirable to provide a limited output to node 32 in any case.

Figure 3:
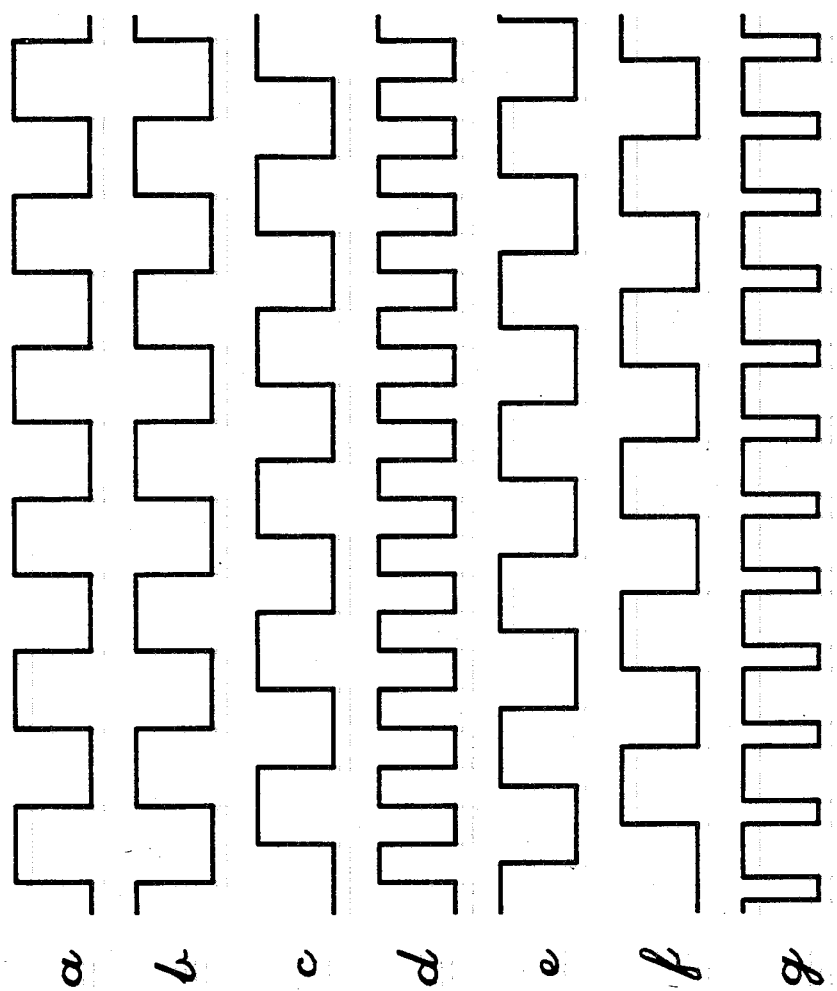
FIG. 3 shows a timing diagram of various signals present in the present invention.

The overall operation of the demodulator of FIG. 1 may be understood by reference to FIG. 3 in conjunction with FIG. 1. FIG. 3a shows a limited I.F. signal at node 22. In considering FIGS. 3b through 3d it should be assumed that the signal of FIG. 3a is at frequency $f_0$. Also, all of the signals of FIG. 3 are shown as limited signals for clarity even though this may not be the case in actual circuit operation. This signal is passed through active filter 26 where it shifted by 180 degrees as shown in FIG. 2 to produce the signal at node 28 as shown in FIG. 3b. Phase shift network 30 then provides a 90 degree phase lag to the signal at node 28 to produce the signal at node 32 which is shown as FIG. 3c. The signal at node 32 is therefore in quadrature with the signal at node 22. EXCLUSIVE OR circuit 24 processes the signals at nodes 22 and 32 to obtain the signal at node 34 which is shown as FIG. 3d. It is seen that by use of an EXCLUSIVE OR gate as the output logic gate a doubling of the frequency occurs. This has the specific advantages in the integrated circuit embodiment of the present invention of increasing the corner frequency requirements of low pass filter 36 and effectively increasing the recovered audio from the demodulator. The use of an EXCLUSIVE OR in this manner makes the operation of the demodulator comparable with a conventional inductor demodulator with a coil based quadrature network having a Q of 10.

The signal at node 34 is passed through low pass filter 36 to provide the output signal at node 37. Low pass filter 36 acts as an integrator or averaging circuit to produce an output which is the average value of the signal at node 34.

Consider now FIGS. 3a and 3e through 3g with the assumption that the signal at node 22 (FIG. 3a) is substantially higher in frequency than $f_0$. In this instance the signal at node 28 is phase shifted by more than 180 degrees as shown FIG. 3e and FIG. 2. Phase shift network 30 still provides 90 degrees of phase shift to this signal to produce the signal at node 32 as shown in FIG. 3f. The resultant signal at node 32 is shifted by more than 90 degrees.

When the signals at nodes 22 and 32 are passed through EXCLUSIVE OR 24, the resultant signal is shown in FIG. 3g. The signal of FIG. 3g clearly has a duty cycle greater than that of FIG. 3d and therefore has a greater average value. Thus, when the signal of FIG. 3g is passed through low pass filter 36, the output is a higher voltage than that obtained when the signal of FIG. 3d is processed by low pass filter 36. In this manner an increase in voltage is obtained as a result of an increase in frequency. In a similar manner, a reduction in output voltage is obtained when the frequency decreases.

Figure 4:
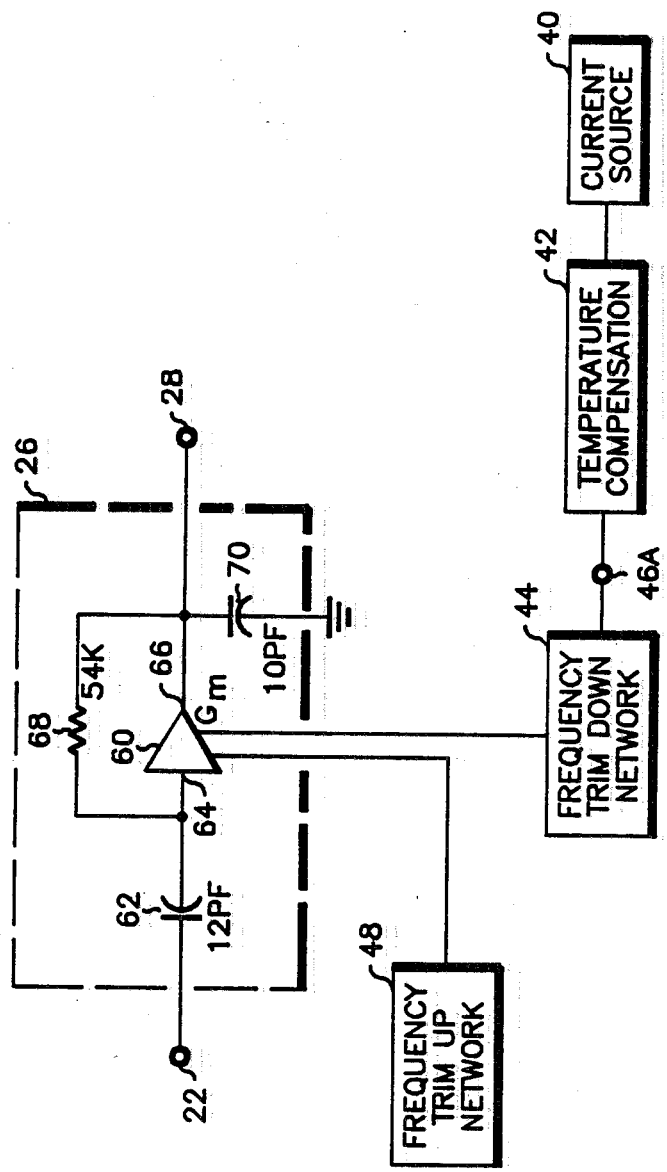
FIG. 4 shows a simplified schematic of the active filter of the present invention along with associated circuitry.

In the preferred embodiment, a transconductance amplifier 60 is utilized to produce the active filter 26 and is connected as shown in FIG. 4. An input capacitor 62 couples the signal at node 22 to the inverting input 64 of the transconductance amplifier. The output 66 of transconductance amplifier 60 is coupled to the input 64 through resistor 68. Capacitor 70 is connected from the output 66 of transconductance amplifier 60 to AC ground. Output 66 is connected to node 28 and forms the output of the active filter. This active filter has a band pass response with center frequency $f_c$ given approximately by:

$$f_c = \frac{1}{2 * pi} * \sqrt{\frac{G_m}{R_{68} * C_{62} * C_{70}}}$$

and the Q given by:

$$Q = \frac{1}{C_{62} + C_{70}} * \sqrt{\frac{G_m * C_{62} * C_{70}}{R_{68}}}$$

where $G_m$ is the transconductance of the transconductance amplifier. These equations indicate that both the center frequency and the Q are functions of transconductance $G_m$ and that the Q can be readily made greater than 1.0. They also indicate that if the temperature coefficient of $G_m$ is made to match the temperature coefficient of the product of resistor 68 and capacitors 62 and 70, that the center frequency of the network will be stable for all temperatures of interest and the Q will also be very temperature stable. Similar filter structures exhibiting an antiresonance at a center frequency dependent upon $G_m$ may also be adjusted in frequency by varying the current and therefore the transconductance of the transconductance amplifier.

The circuit values shown in FIG. 4 as well as the other Figures are presented by way of example and are not to be limiting, but they provide an effective Q of 10 for the demodulator at a center frequency of approximately 455 Khz in the preferred embodiment. By providing a mechanism for adjusting the current of transconductance amplifier 60, the center frequency may be adjusted at the wafer level of the integrated circuit manufacturing process since the transconductance is heavily dependant upon current as one skilled in the art will recognize. Frequency trim networks 46 and 48 are provided to adjust the frequency of the active filter by varying the current down or up respectively without changing the effect of the temperature compensated bias arrangement. Thus, by providing an appropriately compensated bias current having a temperature coefficient equal and opposite in sign to that of the product of resistor 68 and capacitors 62 and 70, the center frequency becomes adjustable over a wide range of frequencies and stable over a wide range of temperatures.

Figure 5:
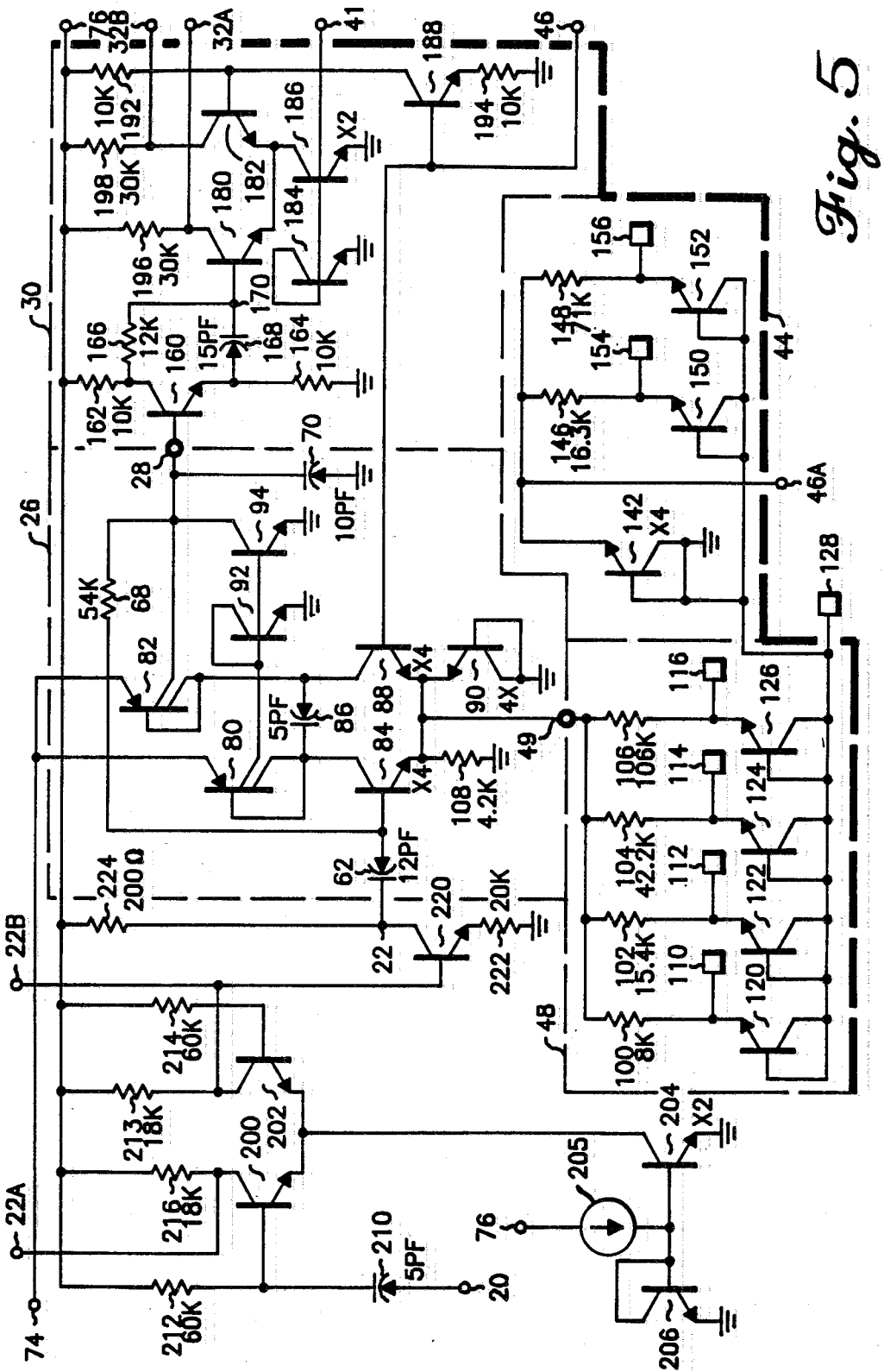
FIG. 5 shows a detailed schematic of the active filter, phase shift network, and frequency trim networks of the present invention.

Turning now to FIG. 5 a more detailed schematic of active filter 26 (shown enclosed in broken lines) is presented as well as detailed schematics of phase shift network 30 and frequency trim networks 44 and 48. An unregulated supply voltage is supplied at node 74 and is preferrably approximately 1.5 volts. A regulated supply of approximately 1.0 volts is applied at node 76. The unregulated supply is applied to the emitter of transistors 80 and 82 each of which are provided with two collectors. The base of transistor 80 is connected to one of its collectors as well as to the collector of transistor 84 and one terminal of capacitor 86. The base of transistor 82 is connected to one of its collectors as well as the collector of transistor 88 and the other side of capacitor 86. The emitters of transistors 84 and 88 are coupled together and are also coupled to node 49 and to ground through resistor 108 and to the emitter of transistor 90. The collector and base of transistor 90 are connected together and coupled to ground.

The second collector of transistor 80 is connected to the bases of transistors 92 and 94. The emitters of transistors 92 and 94 are connected to ground. The collector of transistor 92 is connected to its base and the collector of transistor 94 is connected to the second collector of transistor 82 and node 28. Capacitor 70 is connected from node 28 to ground and resistor 68 is connected from node 28 to the base of transistor 84 which forms input 64 of the transconductance amplifier. The base of transistor 88 is connected to node 46 and node 64 is connected through capacitor 62 to node 22 to complete the transconductance amplifier 26. The base of transistor 88 is nominally biased at approximately 0.67 volts. In the present embodiment, transistors 84 and 88 are X4 transistors (four times the size of a nominal transistor) and transistor 90 is a X4 transistor. Transistors 80 and 82 are PNP transistors and the remainder are NPN in active filter 26.

Operation of the transconductance amplifier is as follows. Transistors 84 and 88 are connected as a differential pair with the base of transistor 84 forming the input of the amplifier. The tail current, that is the combined bias current leaving the emitters of transistors 84 and 88, of the differential amplifier is nominally approximately 45 microamps and is provided through frequency trim up network 48 and resistor 108. The base of transistor 88 is biased by frequency trim down network 44. Capacitor 86 provides compensation to assure stability of the amplifier. Transistors 80 and 82 are part of a current mirror and in conjunction with transistors 92 and 94 they provide balanced bias current to the collectors of transistors 84 and 88. By minimizing the number of P-N junctions between supply and ground, the minimum operating voltage of the circuit is kept at a minimum and in fact the present circuit will function at battery voltages as low as 1.0 volts allowing operation from a single battery cell.

The ac output current flowing from the junction of the collectors of transistors 82 and 94 to capacitor 70 and resistor 68 is proportional to the dc bias current of the differential amplifier and the ac input voltage at the base of transistor 84. The voltage at node 28 lags that at node 22 by approximately 90 degrees and its magnitude is proportional to the bias current. The feedback network made up of resistor 68 and capacitor 70 operates in conjunction with the transconductance amplifier to produce a bandpass response from input to output whose selectivity and center frequency are programmable by adjusting the tail current.

As discussed previously, the center frequency of active filter 26 may be adjusted by either increasing or decreasing its bias current. The frequency may be adjusted upwards by increasing the bias current by way of frequency trim up network 48. Network 48 includes a plurality of resistors 100, 102, 104 and 106 of various values each having one terminal coupled to node 49. These resistors work with resistor 108 to set the current level of the transconductance amplifier. The other terminal of resistor 108 is coupled directly to ground to provide a minimal bias current level for amplifier 26. The second terminals of resistors 100, 102, 104 and 106 are coupled to trim pads 110, 112, 114 and 116 respectively as well as the emitters of NPN transistors 120, 122, 124 and 126. The bases and collectors of transistors 120, 122, 124 and 126 are all coupled together and in turn coupled to ground. Trim pad 128 is also coupled to ground.

Transistors 120, 122, 124 and 126 are each used as zener diodes which may be shorted out by applying an appropriate current pulse between trim pads 110, 112, 114 or 116 and ground pad 128 using known techniques. The actual programming technique is not critical to the present invention and depends upon the dimensions and implementation of the zener diodes as well as integrated circuit processing parameters. Known programming techniques for shorting out zener diodes may be used. Such trims may be performed either prior to or after separation of the integrated circuit wafer into individual dice for wirebonding and packaging in chip carriers, DIP packages or other I.C. packages. Performing the frequency trim to the integrated circuit demodulator at the wafer stage provides a number of advantages. At this stage of processing the circuit the I. C.s may be rapidly trimmed with automated equipment which will be used to test each circuit anyway. Also, since each circuit will have been processed on the same substrate in the same manner, the trim parameters may be more consistent and predictable from circuit to circuit.

The zener knee of these diodes is preferably greater than 6 volts and therefore the diodes present a very high impedance to ground, unless shorted, when used at the very low operating voltages of the preferred embodiment. When shorted they present a resistance of approximately 100 ohms so that resistors 100, 102, 104 and/or 106 may be selectively placed in parallel with resistor 108 to effectively reduce the resistance from node 49 to ground thereby increasing the bias current of the transconductance amplifier 60. In this manner the frequency of active filter 26 may be increased over a range of approximately 100 Khz with the component values shown with resolution of about 5 Khz to obtain frequency tuning. This frequency adjustment may be readily automated with modern computer controlled integrated circuit die probe, test and trim equipment.

The particular values of resistors 100, 102, 104 and 106 are selected in the preferred embodiment such that they provide modulo 2 trimming. That is, resistor 106 causes an increase of approximately 2% in the center frequency of the filter $f_0$. Resistors 104, 102 and 100 cause an increase of 4%, 8% and 16% in the center frequency respectively. These resistors can be selected in any combination to effect an overall increase in center frequency between 2% and 30% with a fine resolution of 2%. In the present embodiment, this 30% range is adequate to ensure adequate upward trimmability of the frequency.

In a similar manner, the bias current to amplifier 60 may be reduced thereby reducing the frequency of the active filter by frequency trim down network 44 shown enclosed in broken lines in FIG. 5. It is also helpful to view portions of network 42 of FIG. 6 to understand the present circuit. Transistor 140 of temperature compensation network 42 has its base and collector connected to node 46. The emitter of transistor 140 is connected to the emitter of transistor 142 at node 46a and to one side of each of resistors 144 (FIG. 6), 146 and 148. The base and collector of transistor 142 is connected to ground as is the second terminal of resistor 144. The second terminals of resistors 146 and 148 are connected to the emitter of transistors 150 and 152 respectively and trim pads 154 and 156 respectively. The base and collectors of transistors 150 and 152 are coupled to ground so that transistors 150 and 152 are used as zener diodes in a manner similar to those of network 48. Transistor 140 is a X2 NPN transistor while transistors 142, 150 and 152 are PNP transistors. Transistor 142 is a X4 transistor.

The base of transistor 88 is normally biased to a voltage that is determined by the temperature compensated bias current, by resistor 144 and by diode connected transistor 140. This voltage may be adjusted by shorting out transistors 150 and/or 152 to reduce the voltage reference level at the base of transistor 88 thereby reducing the current of amplifier 60 and hence reducing the frequency of the active filter 26. Transistors 84; 88 and 140 are matched devices so that the bias current flowing through resistor 108 has temperature characteristics that match those of the compensated current used to bias the network formed by diode connected transistor 140 and resistor 144. Further, the required temperature compensation is maintained when the network is adjusted by shorting out diodes 150 and/or 152. That is, since resistors 104, 146, 148 and 108, 100, 102 and 106 are all matched structures programming any of the zener diodes in the trim networks acts to change the effective value of the resistor in the bias networks, but does not effect the temperature characteristics of the amplifier. Again, the trim process may also be readily automated.

The values of resistors 146 and 148 are selected such that they provide a coarse frequency trim. Resistor 146 is trimmed when variations in component values are mid-range (approximately 15%). When the variations are maximum (approximately 30%), resistor 148 is trimmed. Once the coarse trimming is completed, fine trimming is done with the trim-up network 48 by selecting resistors 100, 102, 104 and/or 106 in the manner previously described. By utilizing this coarse downward adjustment in conjunction with the fine downward adjustment the number of trim pads required on the integrated circuit is minimized thereby more effectively utilizing substrate area on the integrated circuit. One skilled in the art will recognize that the present invention may alternatively be implemented with a coarse upward trim in frequency and a fine downward trim in frequency.

The frequency trimming process may be carried out by monitoring the audio response of the demodulator. Various audio charactistics including the peak or valley of the demodulator's "S curve", distortion or balanced noise may be used as indicators of a correct trim. It should be noted, however, that the present trim method is substantially independent of temperature. After the trim is complete, the integrated circuit wafer may be cut into individual die for bonding and packaging.

The phase shift network is also shown in detail in FIG. 5. The base of NPN transistor 160 forms the input of the phase shift network 30 and is coupled to node 28. Resistor 162 is connected between the collector of transistor 160 and the regulated supply (node 76). The emitter of transistor 160 is connected to one side of resistor 164 and the other side of resistor 164 is grounded. One side of resistor 166 is connected to the collector of transistor 160 and the other side is connected to one side of capacitor 168 at node 170. The other side of capacitor 168 is connected to the emitter of transistor 160. These components provide the basis of the phase shift network with the phase shift appearing at node 170. The operation of the phase shift network is straight forward and described in the art.

The phase shifted signal at node 170 is applied to a differential amplifier made up of transistors 180, 182, 184, 186 and 188. Node 170 is coupled to the base of transistor 180 and the emitters of transistors 180 and 182 are connected to the collector of transistor 186. The base and collector of transistor 184 are connected to the base of transistor 186 and to node 41. The emitters of transistors 184 and 186 are connected to ground. The base of transistor 188 is connected to node 46 and the collector is connected to the base of transistor 182 and one side of resistor 192. The other side of resistor 192 is connected to node 76. The emitter of transistor 188 is connected through resistor 194 to ground. The collectors of transistors 180 and 182 respectively are connected to nodes 32a and 32b respectively. The collectors of transistors 180 and 182 are also connected to node 76 through resistors 196 and 198 respectively. Transistors 180, 182, 184, 186 and 188 are all NPN transistors and transistor 186 is a X2 transistor in the present embodiment.

The differential amplifier of phase shift network 30 operates as a conventional differential amplifier which provides inverted and non-inverted outputs to nodes 32a and 32b. Splitting the signal in this manner is advantageous to reduce circuitry and increase speed for processing in the EXCLUSIVE OR. This differential amplifier also serves as a limiter to square up the signal at node 170 to assure the highest possible recovered audio level, and to insure that the operation of the circuit is independent of input signal level.

The remaining circuitry shown in FIG. 5 serves primarily as an interface to the receiver front end in addition to providing a degree of I.F. amplification. Transistors 200 and 202 form a differential pair with their emitters coupled together to the collector of transistor 204. The base of transistor 204 is connected to the base and collector of transistor 206 and also to a 10 microamp current source 205. The emitters of transistors 204 and 206 are grounded.

The base of transistor 200 is connected to 20 through capacitor 210 to provide the input of the differential amplifier. The bases of transistors 200 and 202 are connected to node 76 through resistors 212 and 214 respectively. The collectors of transistors 200 and 202 are connected through resistors 216 and 218 to node 76. The output of the differential amplifier is taken at the collectors of transistors 200 and 202 to provide inverted and non-inverted outputs 22a and 22b for processing by EXCLUSIVE OR 24. Node 22b is also coupled to the base of transistor 220. The emitter of transistor 220 is connected to ground through resistor 222 and the collector is coupled to node 76 through resistor 224 and node 22. Transistor 220 is connected as a common emitter amplifier with a gain of approximately 1/100 and is used to reduce the level of the signal at node 22b to a level suitable for processing by the active filter 26. Transistors 200, 202, 204, 206 and 220 are all NPN transistors and transistor 204 is a X2 transistor.

Figure 6:
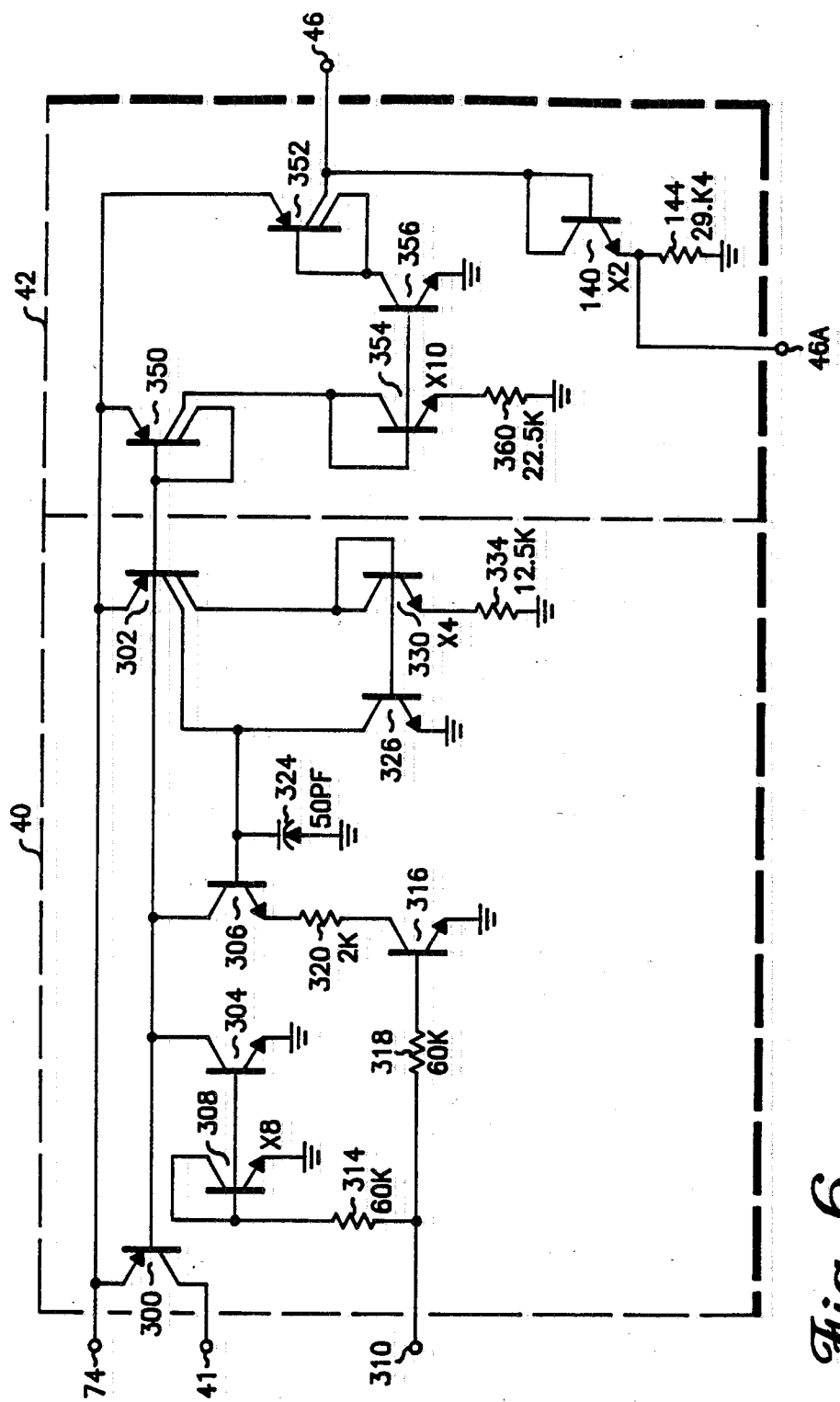
FIG. 6 shows a detailed schematic of the current source and temperature compensation network of the present invention.

Turning now to FIG. 6, the current source 40 and temperature compensation network 42 are shown in detail. The unregulated supply is provided at node 74 which is coupled to the emitter of transistors 300 and 302. The base of transistors 300 and 302 are also coupled together and coupled to the collectors to transistors 304 and 306. The base of transistor 304 is coupled to the base and collector of transistor 308. The emitters of transistors 304 and 308 are grounded. The base of transistor 308 is connected to node 310 through resistor 314. The base of transistor 316 is coupled to node 310 through resistor 318. The emitter of transistor 316 is grounded and the collector of transistor 316 is connected to the emitter of transister 306 through resistor 320.

The base of transistor 306 is coupled to one side of capacitor 324, a first collector of transistor 302 and the collector of transistor 326. The other side of capacitor 324 is grounded as is the emitter of transistor 326. The base of transistor 326 is connected to the base and emitter of transistor 330 as well as the second collector of transistor 302. The emitter of transistor 330 is connected to ground through a diffused current setting reference resistor 334. Transistors 300 and 302 are PNP transistors and transistors 304, 308, 316, 326 and 330 are NPN transistors. In addition, transistor 330 is a X4 transistor and transistor 308 is a X8 transistor. The collector of transistor 300 is coupled to node 41 and forms the output of the current source.

The current source is a band-gap based reference circuit that operates as follows. Transistors 326, 330, 306, and 302 form a feedback loop in which the ratio of the junction areas of 326 and 330, together with the value of 334, establish a reference current flow through 326 and 330 that is given by:

$$I_{ref} = \frac{(kT/q) * \ln(A)}{R_{334}}$$

WHERE:
k=Boltzmann's constant
T=Temperature in degrees Kelvin
q=electronic change
A=ratio of emitter area of 330 divided by the emitter area of 326.

The bias voltage established by the reference circuit on the base of transistor 302 further biases other similar transistors connected to this node to mirror the reference current. Thus, the reference current is mirrored by transistor 300, the collector current of 300 biases transistors 184 and 186 of the phase shift network 30 and transistors 440, 442, and of EXCLUSIVE OR 24 to provide a controlled current mirror type current source.

When node 310 is connected to a logic high voltage, transistor 316 is turned ON by the current flowing through resistor 318, and the collector of 316 saturates, thereby grounding the end of 320 and turning on the current source. When the node 310 is connected to a logic low, transistor 316 is turned off as is transistor 304 causing base bias to be removed from transistors 300 and 302 thereby shutting off the current source.

Temperature compensation network 42 is also shown in FIG. 6 in detail. The emitter of transistor 350 is connected to the battery voltage at node 74 as is the emitter of transistor 352. The base of transistor 350 is coupled to a first collector of transistor 350 as well as the base of transistor 302 of current source 40. The second collector of transistor 350 is connected to the base and collector of transistor 354 and the base of transistor 356. The emitter of transistor 354 is grounded through an ion implanted current setting reference resistor 360. Transistor 354 forms the compensation diode for a current mirror circuit formed by transistors 354, 350, 352, 356 and resistor 360. The emitter of transistor 356 is grounded. The collector of transistor 356 is connected to the base of and a first collector of transistor 352. The second collector of transistor 352 is connected to node 46 and provides the output of temperature compensation network 42. Transistors 350 and 352 are PNP transistors and transistors 354 and 356 are matched NPN transistors, with transistor 354 being 10X larger in emitter area than transistor 356.

Temperature Compensation network 42 is designed to generate an output current with a positive temperature coefficient on the order of +9000 parts per million per degree Celcius (ppm) to compensate for the approximately equal but negative temperature coefficient of the active filter resulting mainly from variations in resistor 68, capacitors 62 and 70, the transistor emitter resistance $r_e$ and device current gain variations over temperature. Since the base current of transistor 350 is also supplied through transistor 306, the compensation network is also controlled by node 310.

The operation of the temperature compensation network is as follows. A bias current that mirrors the reference current established by current source 40 flows from one collector of transistor 350 through diode connected transistor 354 and implanted resistor 360. This current is in turn mirrored by a current multiplying current mirror formed by the combination of transistors 354 and 356 and resistor 360 to establish an output current in the collector of 356 that is further mirrored by PNP transistor 352 to the output node 46. A key aspect of the design of the temperature compensation bias circuit is that it intentionally uses different resistor structures with different temperature characteristics in current mirror circuits to generate an output current with a temperature coefficient that can be varied over a wide range simply by appropriate selection of the resistor values and mirror parameters.

Thus, diffused resistor 334 of current source 40 is fabricated with the same diffusion that forms the bases of the NPN transistors and has a temperature coefficient of approximately +1500 to +1800 parts per million per degree Celcius (ppm). The collector current of transistor 350, thus, has a temperature coeffeicient (T.C.) of approximately +1700 ppm, which is the result of its T.C. being a function of TO (300 degrees Kelvin) and the T.C. of resistor 334. In order to exactly compensate for the temperature variations of the network 26, the physical structure and voltage drop across resistor 360 have been selected to generate the required temperature characteristics. As will be demonstrated mathematically, the T.C. of the output current of the compensation network can be adjusted over a wide range by appropriate selection of the structures used to form resistors 334 and 360 and other mirror parameters.

For the specific embodiment shown here, an ion-implanted resistor structure with a sheet resistance of 2K ohms/square and a T.C. of approximately +4200 ppm is used to implement resistor 360.

The current in node 46 has a T.C. which follows the equation:

$$\frac{dI/I}{dT} = \frac{dI1/I1}{dT}\left(1 + \frac{RI1}{Vt}\right) + \frac{RI1}{Vt}\left(\frac{dR/R}{dT} - \frac{dVt/Vt}{dT}\right)$$

where:

$$\frac{dI1/I1}{dT}$$

is the T.C. of the collector current in transistor 350 which is approximately −900 ppm if resistor 334 is implanted or approximately +1700 ppm if it is diffused.

I1 is the collector current of transistor 350. (dependant upon resistor 334)

Vt is the thermal voltage kT/q=26 mv at room temperature.

$$\frac{dR/R}{dT}$$

is the T.C. of resistor 360.

$$\frac{dVt/Vt}{dT}$$

= 1/T. (T = temperature)

R is resistor 360.

Simplification of the above equations reveals that the resultant temperature coefficient of the current leaving node 46 is a function of the temperature coefficient of the current leaving the collector of transistor 350 (I1) plus a predetermined algebraic multiplier or boost factor (I1R/Vt) times the current I1 plus the multiple times the difference between the T.C. of resistor 360 and the T.C. of the thermal voltage.

In this embodiment, a temperature coefficient of approximately +9000 ppm for the output current is achieved in order to appropriately compensate the active filter. However, the present temperature compensation network should not be limited to this preferred embodiment since a wide range of temperature coefficients may be implemented using the principal disclosed.

By substitution into the above equations, it can be seen that using resistors 334 and 360 of the same temperature coefficient results only in circuit redundancy with the same T.C. of current in the collectors of transistors 350 and 352. This is the case if both resistors are either diffused (T.C. of resistance approximately +1700 ppm), implanted (T.C. of resistance approximately +4200 ppm) or an external carbon resistor (T.C. of resistance approximately 100 ppm).

Various ranges of temperature coefficients of current can be obtained at the collector of transistor 352 by appropriately selecting various combinations of the above resistor types (or other temperature dependent resistive elements such as thermisters). For example, if resistor 334 is external and resistor 360 is diffused, a positive T.C. can be achieved to any desired degree above approximately 3200 ppm without otherwise modifying the circuit of FIG. 6. In this example the above equation reduces to:

$$\frac{dI/I}{dT} = (3300 - 100)\left(1 + \frac{RI1}{Vt}\right) + \frac{RI1}{Vt}(1700 - 3300) \text{ ppm}$$

$$\frac{dI/I}{dT} = 3200 + \frac{1600RI1}{Vt} \text{ ppm}$$

By appropriate adjustment of the current I1 and the value of resistor 360 (R) any T.C. above approximately 3200 can be achieved. Similar results occur if resistor 360 is implanted and resistor 334 is external except that smaller values of resistor 360 will be required.

A similar analysis with resistor 360 external and resistor 334 diffused results in the following:

$$\frac{dI/I}{dT} = 1600 - \frac{1600RI1}{Vt} \text{ ppm}$$

In this case either a negative or positive T.C. can be achieved and in fact near 0.0 ppm can readily be implemented if desired.

Another interesting example occurs if resistor 334 is implanted and 360 is diffused. In this case, the equation reduces to:

$$\frac{dI/I}{dT} = -900 - \frac{2500RI1}{Vt} \text{ ppm}$$

and the T.C. can be made to be virtually any negative value required.

Clearly many other permutations of the above analysis may be carried out with various results. It should be noted, however, that in each case a multiplication of the temperature coefficients takes place by a controllable factor of RI1/Vt which may be uses to boost or cut the T.C. as required. This means that the T.C. obtainable by use of the present invention is not restricted to the T.C. of either or both of the resistive components.

Figure 7:
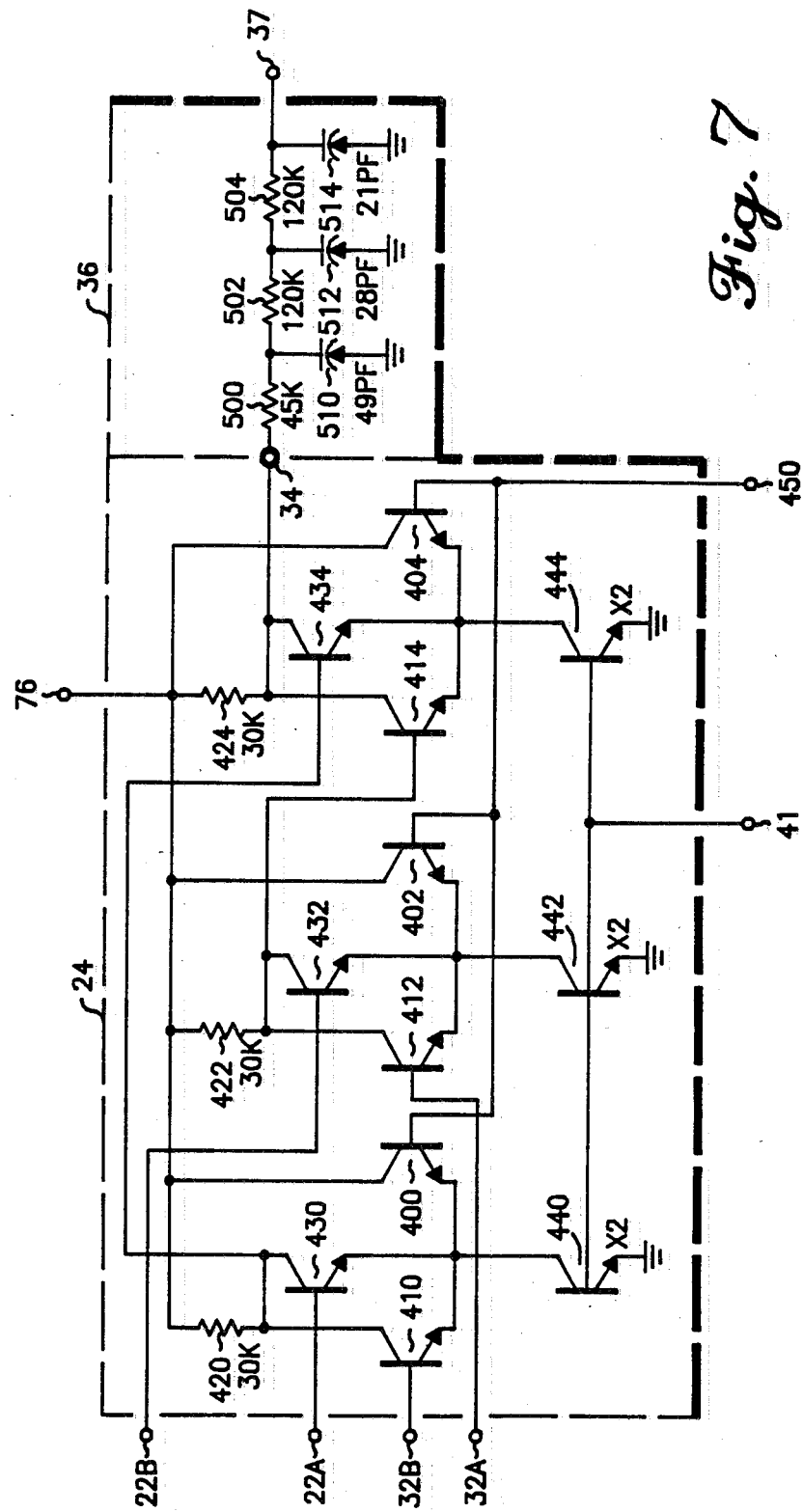
FIG. 7 shows a detailed schematic of the EXCLUSIVE OR and low pass filter of the present invention.

Turning now to FIG. 7 the preferred EXCLUSIVE OR gate 24 is shown in detail along with the low pass filter 36. The regulated supply voltage at node 76 is coupled to the collectors of transistors 400, 402 and 404. The collectors of transistors 410, 412 and 414 are also connected to node 76 through resistors 420, 422 and 424 respectively. The emitters of transister 400 is connected to the emitters of transistors 410 and 430 as well as the collector of transistor 440. The emitter of transistor 402 is connected to the emitters of transistors 412 and 432 as well as the collector of transistor 442. The emitter of transistor 404 is connected to the emitters of transistors 414 and 434 as well as the collector of transistor 444. The emitters of transistors 440, 442 and 444 are all grounded and the bases are connected to node 41.

The collector of transistor 430 is connected to the collector of transistor 410 and the base of transistor 434. The base of transistor 430 is connected to node 22a. The bases of transistors 400, 402 and 404 are all coupled to a node 450 which is connected to a 0.82 volt reference source (not shown). The collector of transistor 432 is connected to the collector of transistor 412 and the base of transistor 414. The base of transistor 432 is coupled to node 22b. Nodes 32a and 32b are connected to the bases of transistors 412 and 410 respectively. The collector of transistor 434 is the output of the EXCLUSIVE OR and is coupled to node 34 as well as the collector of transistor 414.

The EXCLUSIVE OR 24 operates as follows. Transistors 440, 442 and 444 provide bias current to the gate. Transistors 400, 410 and 430 function as a NOR gate providing a low output at the collector of transistor 430 when node 22a or 32b is at a logic high. Similarly, transistors 402, 412 and 432 function as an NOR gate providing a low output at the collector of transistor 432 when nodes 22b or 32a are at a logic high. Transistors 404, 414 and 434 also function as a NOR gate operating on the output signals of the previous two NOR gates to provide a logic low output at the collector of transistor 434 when either of the outputs of the previous two NOR gates are high.

Low pass filter 36 is also shown in detail in FIG. 7 as a simple 3 stage passive R-C ladder network made up of resistors 500, 502 and 504 connected in series with one side of resistor 500 coupled to node 34 and one side of resistor 504 connected to node 37 to form the output node. Capacitor 510 is connected from the junction of resistors 500 and 502 to ground. Capacitor 512 is connected from the junction of resistors 502 and 504 to ground and capacitor 514 is coupled from node 37 to ground.

Low pass filter 36 provides approximately 53 dB of attenuation at 455 Khz and approximately 70 dB of attenuation at 910 Khz. This has been found to be an adequate level of filtering for many applications but in some instances this may not be an adequate level of filtering. Further stages of either passive or active filtering may of course be added either on or off the integrated circuit. Such filtering may be readily accomplished in audio amplifier stages which normally follow the low pass filter.

The above-described demodulator may be totally integrated on a single integrated circuit chip implemented with conventional bipolar linear integrated circuit fabrication processes. The demodulator provides performance comparable to that of more conventional inductor based demodulators providing a nominal audio output level of approximately 20 mv peak to peak for 2.5 Khz of deviation. The center frequency is stable to within ±5% from −20 to +60 degrees Celcius. The circuit operates on a battery voltage from 1.0 to 3.0 volts and consumes less than 75 microamps of current. In addition the expensive, unreliable and bulky inductor has been totally eliminated without sacrificing performance to significantly reduce the cost, size and weight in addition to increasing reliablilty and eliminating a labor intensive and costly manual adjustment of an inductor.

While particular PNP and NPN junction transistor arrangements have been described in conjunction with the present invention, it will be clear to those skilled in the art that other specific circuit arrangements may be used without departing from the spirit and teachings of the present invention. For example, many of the circuits presented utilizing NPN transistors could have equally well have been implemented with PNP transistors. Similarly, analagous circuitry implemented in various field effect device technologies may be possible for many of the circuits presented. The present invention includes such embodiments.

Thus it is apparent that in accordance with the present invention an apparatus that fully satisfies the objectives, aims and advantages is set forth above. While the invention has been described in conjunction with a specific embodiment, it is evident that many alternatives, modifications, and variations will become apparent to those skilled in the art in light of the foregoing description. Accordingly, it is intended that the present invention embrace all such alternatives, modifications and variations as fall within the spirit and broad scope of the appended claims.

What is claimed is:

1. An adjustable active filter, comprising:
a transconductance amplifier having an input and an output and a first bias resistor;
a current source for providing a controlled level of bias current to said transconductance amplifier;
a feedback network coupled to said input and said output for establishing predetermined filter characteristics from said input to said output, said filter characteristics including a resonant frequency which is a function of the transconductance of said transconductance amplifier; and
first current adjusting means, coupled to said transconductance amplifier, for adjusting the current provided by said current source to said transconductance amplifier, said first current adjusting means including a first resistor which may be selectively placed in parallel with said first bias resistor, whereby
selectively placing said first resistor in parallel with said first bias resistor alters the transconductance of said transconductance amplifier thereby effectively adjusting said resonant frequency of said filter.

2. The adjustable active filter of claim 1, further including:
a second bias resistor coupled to said transconductance amplifier; and
second current adjusting means, coupled to said transconductance amplifier, for adjusting the current provided by said current source to said transconductance amplifier, said second current adjusting means including a second resistor which may be selectively placed in parallel with said second bias resistor.

3. The adjustable active filter of claim 2, wherein said first current adjusting means provides for effecting an increase in bias current to said transconductance amplifier and said second current adjusting means provides for effecting a decrease in bias current to said transconductance amplifier.

4. The adjustable active filter of claim 2, wherein said first current adjusting means provides for effecting a fine current adjustment and said second current adjusting means provides for a coarse current adjustment.

5. The adjustable active filter of claim 1, further including a first zener diode in series with said first resistor and wherein said first resistor may be placed in parallel with said first bias resistor by short circuiting said first zener diode.

6. The adjustable active filter of claim 2, further including a second zener diode in series with said second resistor and wherein said second resistor may be placed in parallel with said second bias resistor by short circuiting said second zener diode.

7. The adjustable active filter of claim 1, wherein said first current adjusting means further includes a first plurality of resistors which may be selectively placed in parallel with said first bias resistor to effect a change in said bias current; said first plurality of resistors including said first resistor.

8. The adjustable active filter of claim 2, wherein said second current adjusting means further includes a second plurality of resistors which may be selectively placed in parallel with said second bias resistor to effect a change in said bias current; said second plurality of resistors including said second resistor.

9. The adjustable active filter of claim 8, wherein said second plurality of resistors includes resistors having values which provide for a modulo 2 adjustment in said resonant frequency.

* * * * *